United States Patent [19]
Strübin

[11] Patent Number: 6,040,688
[45] Date of Patent: Mar. 21, 2000

[54] ELECTRICAL CURRENT SUPPLY DEVICE WITH INCORPORATED ELECTRICAL CURRENT SENSOR

[75] Inventor: Pierre Strübin, Bellevue, Switzerland

[73] Assignee: Liaisons Electronique - Mecaniques Lem S.A., Switzerland

[21] Appl. No.: 09/209,394

[22] Filed: Dec. 10, 1998

[30] Foreign Application Priority Data

Jan. 28, 1998 [CH] Switzerland .............................. 0207/98

[51] Int. Cl.[7] ...................................................... H03H 1/00
[52] U.S. Cl. ............................................. 323/368; 323/229
[58] Field of Search .................................... 323/222, 229, 323/283, 284, 368

[56] References Cited

U.S. PATENT DOCUMENTS 5,450,000  9/1995  Olsen ........................................ 323/222

*Primary Examiner*—Shawn Riley
*Attorney, Agent, or Firm*—Clifford W. Browning; Woodard, Emhardt, Naughton Moriarty & McNett Patent and Trademark Attorneys

[57] ABSTRACT

A current supply device for supplying a direct current, a sinusoidal current or a pulsed current to a load, the device having a conductor portion arranged for being connected in series with the load, the conductor portion being coupled with a magnetic circuit having at least one air-gap, a magnetic field detector device being arranged in the air-gap and being connected to a measuring or control circuit for producing an output signal representing the current supplied by the current supply device.

5 Claims, 1 Drawing Sheet

ELECTRICAL CURRENT SUPPLY DEVICE WITH INCORPORATED ELECTRICAL CURRENT SENSOR

BACKGROUND OF THE INVENTION

The present invention relates to an electrical current supply device for supplying a direct current, a sinusoidal current or a pulsed current to a load, and more particularly to a current supply device comprising self-induction means for smoothing the current supplied or for absorbing transient phenomena. In a device of the kind to which the invention applies, said self-induction means include a magnetic circuit coupled with a conductor portion through which flows the current to be supplied, said conductor portion being for example in the form of a winding arranged around a portion of said magnetic circuit or in the form of a straight conductor portion passing through said magnetic circuit. Generally, the magnetic circuit has at least one air-gap used mainly to prevent saturation of the material forming the magnetic circuit.

Current sensing devices are known which use the detection of a magnetic field generated in the air-gap of a magnetic circuit by a current to be measured, said current flowing in a conductor coupled with this magnetic circuit.

The addition of a current sensing unit to a current supply device results in costs and in overall dimensions which are in many cases unacceptable in practice.

An object of the invention is to provide a current supply device of the above mentioned type which is combined with a current sensor in such a manner as to require minimal space and being quite inexpensive to manufacture.

BRIEF SUMMARY OF THE INVENTION

A current supply device according to the invention comprises a conductor portion arranged for being connected in series with a load, said conductor portion being coupled with a magnetic circuit having at least one air-gap, a magnetic field detector device being arranged within said air-gap and being connected to a measuring or control circuit for producing an output signal representing the current supplied by said current supply device.

Further characteristics, objects and advantages of the invention will become apparent from the description of an embodiment given hereafter by way of example and illustrated in the appended drawings.

DETAILED DESCRIPTION OF THE INVENTION

Figure 1:
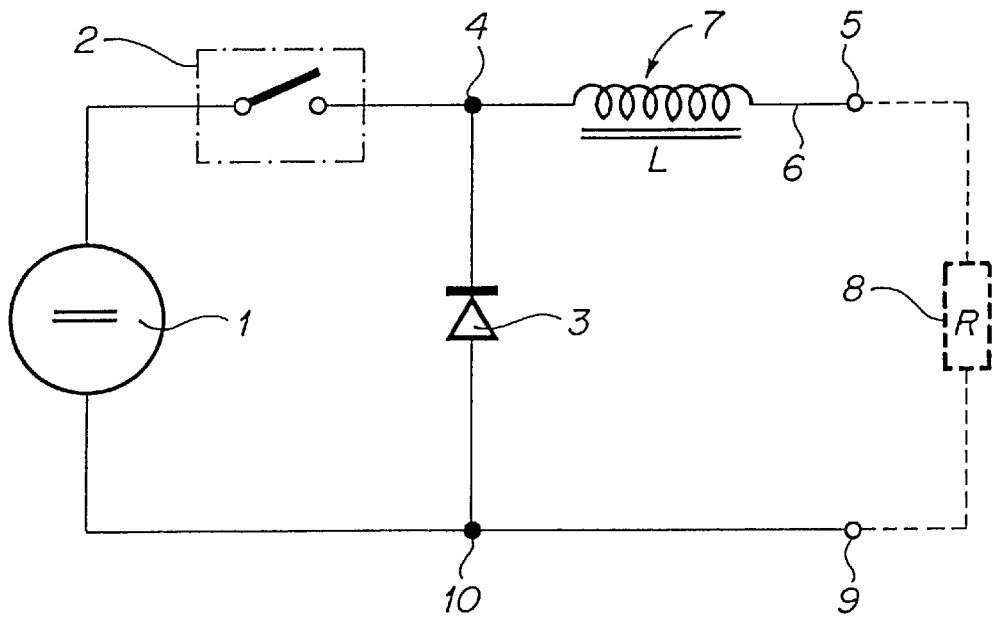
FIG. 1 is a schematic diagram of a current supply device of the chopper type.

The device of FIG. 1 includes a d.c. voltage source 1 connected to an electronic switch 2, consisting for instance of an MOS transistor the conductive part of which is mounted in series with a recovery diode 3. The connection point 4 common to the switch 2 and to the diode 3 is connected to an output terminal 5 of the device via a conductor 6, self-induction means being formed or inserted in this circuit branch of the device. A load 8 is mounted between the terminal 5 and a second output terminal 9 of the current supply device, this second terminal being connected to the common connection point 10 of the diode 3 and the d.c. voltage source 1.

When switch 2 is closed, the current in the load 8 increases with a slope determined by the electrical time constant of the circuit, namely L/R, wherein L is the inductance of the self-induction means 7 and R is the resistance of the load 8. When the switch 2 is opened, the current decreases with the same time constant, through diode 3. This model is valid in first approximation, the parasitic resistances and inductances of the electric circuit and of the semi-conductors being neglected.

The self-induction means 7 ensure a smoothing of the current supplied by the current supply device. This function is found in most current converters including for example bridge circuits, half-bridge circuits, push-pull circuits, etc.

Figure 2:
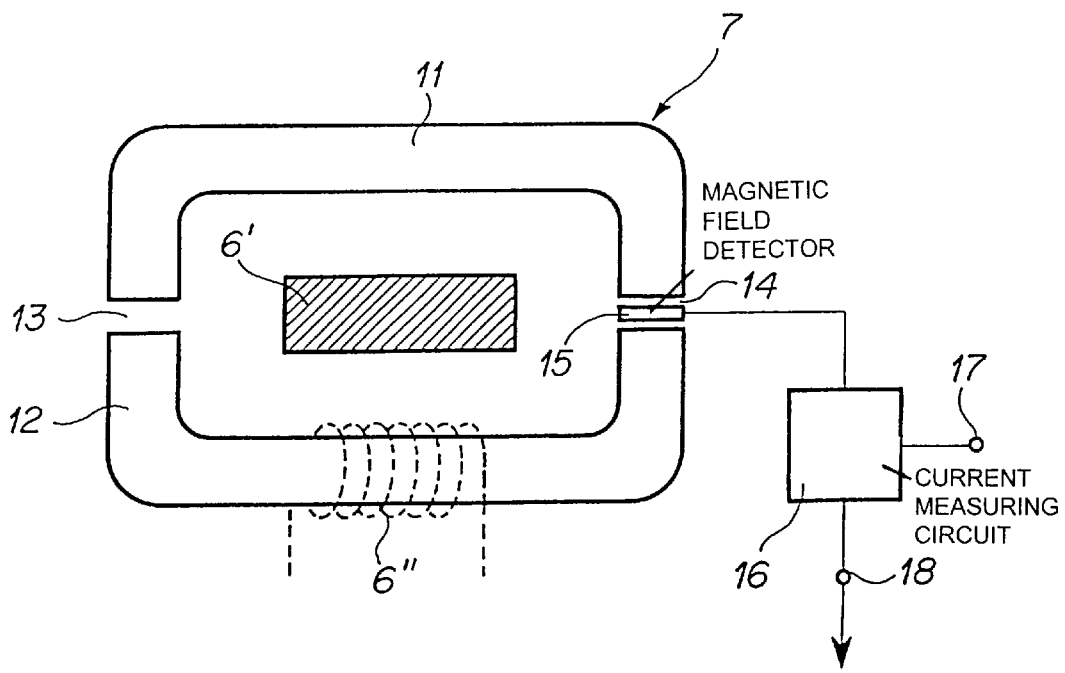
FIG. 2 is a schematic view of the arrangement of a magnetic field detector in the air-gap of a magnetic circuit of self-inductance means which are part of the device of FIG. 1.

FIG. 2 illustrates schematically two forms of embodiment of self-induction means 7 as used in relation with the present invention. According to a first embodiment, the conductor 6 has a linear conductor portion 6' extending in a direction perpendicular to the plane of the drawing. It is surrounded by a magnetic circuit comprised of two U-shaped branches 11 and 12 made of a magnetically permeable material, for example of ferrite, with the two mutually facing ends of the branches 11 and 12 defining two air-gaps 13 and 14. In another embodiment shown in dashed lines, the conductor 6 includes a winding 6", for example of two or more turns, arranged around one of the branches, such as 12, of the magnetic circuit.

According to the present invention, the magnetic field is measured in an air-gap of the magnetic circuit, for instance in the air-gap 14, by a magnetic field detector 15 placed in this gap, such as a Hall-effect device, a magneto-sensitive resistor of the GMR-type (Giga Magneto Resistance), a flux gate device or any other appropriate device capable of detecting magnetic fields. A conventional measuring circuit 16 is connected to the detector 15 for producing an output signal which is the image of the current flowing in the conductor 6. It is to be noted that the magnetic field detected in the air-gap 14 is proportional to the current to be measured when the magnetic circuit is not saturated. The output signal obtained can be processed in an appropriate manner and can be used in particular for the control of the current supply device in order to protect the load.

Detector 15 can be mounted in the air-gap by usual means and can be connected to a circuit printed on an existing support or on a separate support provided with pins or other connection means, for example connection means 17 for supplying power to the measuring circuit and connection means 18 for transmitting the output signal to a user device.

The incorporation of a current sensor into self-induction means provided in the current supply device avoids having to use a separate magnetic circuit and thus provides a solution to the critical problems of the excessive bulk and of the high cost of current supply installations with separate current sensing units.

What is claimed is:

1. A current supply device for supplying a direct current, a sinusoidal current or a pulsed current to a load, said device comprising a conductor portion and a self-induction means connected in series with said load, said self-induction means adapted to smooth said current or absorb transient current wherein said self-induction means comprises a magnetic circuit coupled with said conductor portion and having at least one air-gap, a magnetic field detector device being arranged in said air-gap and being connected to a measuring or control circuit for producing an output signal representing the current supplied by said current supply device.

2. A device according to claim 1, wherein said conductor portion includes a winding arranged around a portion of said magnetic circuit.

3. A device according to claim 1, wherein said conductor portion is a straight portion and said magnetic circuit is arranged around said conductor portion.

4. A device according to claim 1, wherein said magnetic field detector is a Hall-effect device, a magneto-sensitive resistor or a flux gate device.

5. A device according to claim 1, wherein said measuring or control circuit is made, at least in part, as a printed circuit provided with means for connecting said circuit to other parts of the current supply device, to ensure the current supply of the measuring or control circuit and/or the transmission of said output signal to signal processing circuits and/or circuits controlling the current supply device.

* * * * *